(12) United States Patent
Koo (10) Patent No.: US 6,559,675 B2
(45) Date of Patent: May 6, 2003

(54) DATA OUTPUT BUFFER CIRCUIT USABLE WITH BOTH PCI AND PCI-X BUSES

(75) Inventor: Kyoung-Hoi Koo, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/950,762

(22) Filed: Sep. 12, 2001

(65) Prior Publication Data

US 2002/0057106 A1 May 16, 2002

(30) Foreign Application Priority Data

Nov. 15, 2000 (KR) .................................. 2000-0067773
May 18, 2001 (KR) .................................. 2001-0027287

(51) Int. Cl.[7] ........................................ H03K 19/0175
(52) U.S. Cl. ........................ 326/81; 327/112; 327/333
(58) Field of Search ............................ 326/80, 81, 82, 326/83, 86; 327/112, 77, 333

(56) References Cited

U.S. PATENT DOCUMENTS

| 5,576,635 | A | * | 11/1996 | Partovi et al. | 326/27 |
| 5,629,634 | A | * | 5/1997 | Carl et al. | 326/27 |
| 6,323,704 | B1 | * | 11/2001 | Pelley et al. | 327/112 |

* cited by examiner

Primary Examiner—Daniel Chang
(74) Attorney, Agent, or Firm—F. Chau & Associates, LLP (57) ABSTRACT

Disclosed is a data processing system comprising a control unit for receiving data from a main core and outputting given control signals, a level shifter for amplifying the electric potential of said given control signals and outputting corresponding driving signals, a data output buffer for receiving said driving signals from said level shifter and outputting a driving voltage having a voltage range defined in the PCI or/and PCI-X specifications, to an input/output pad, and said data output buffer being in a high impedance state to prevent a PCI mode voltage inputted to said pad from being leaked to a power source terminal when said data processing system is operated in PCI mode.

19 Claims, 6 Drawing Sheets

Fig. 1

(Prior Art)

DATA OUTPUT BUFFER CIRCUIT USABLE WITH BOTH PCI AND PCI-X BUSES

CROSS-REFERENCE TO RELATED APPLICATIONS

This application claims priority to Korean Patent Application No. 2000-67773 filed on Nov. 15, 2000, and Korean Patent Application No. 2001-27287 filed on May 18, 2001, the contents of both of which are herein incorporated by reference in their entirety.

FIELD OF THE INVENTION

The invention relates to a data processing system, and more particularly to a data processing system having a data output buffer that can be used as both a peripheral component interconnect (PCI) buffer and a peripheral component interconnect extended (PCI-X) buffer.

BACKGROUND OF THE INVENTION

It is common for personal computers or work station systems to be equipped with a PCI bus for data transmission between components.

A PCI bus must comply with different operating standards for its buffer in accordance with different signal voltage environments. For example, a PCI bus buffer must comply with a maximum data transfer rate of 533 MB/sec at an operational frequency of 66 MHz in a 3.3V signal voltage environment, and a maximum data transfer rate of 133 MB/sec at an operational frequency of 33 MHz in a 5V signal voltage environment.

Figure 1:
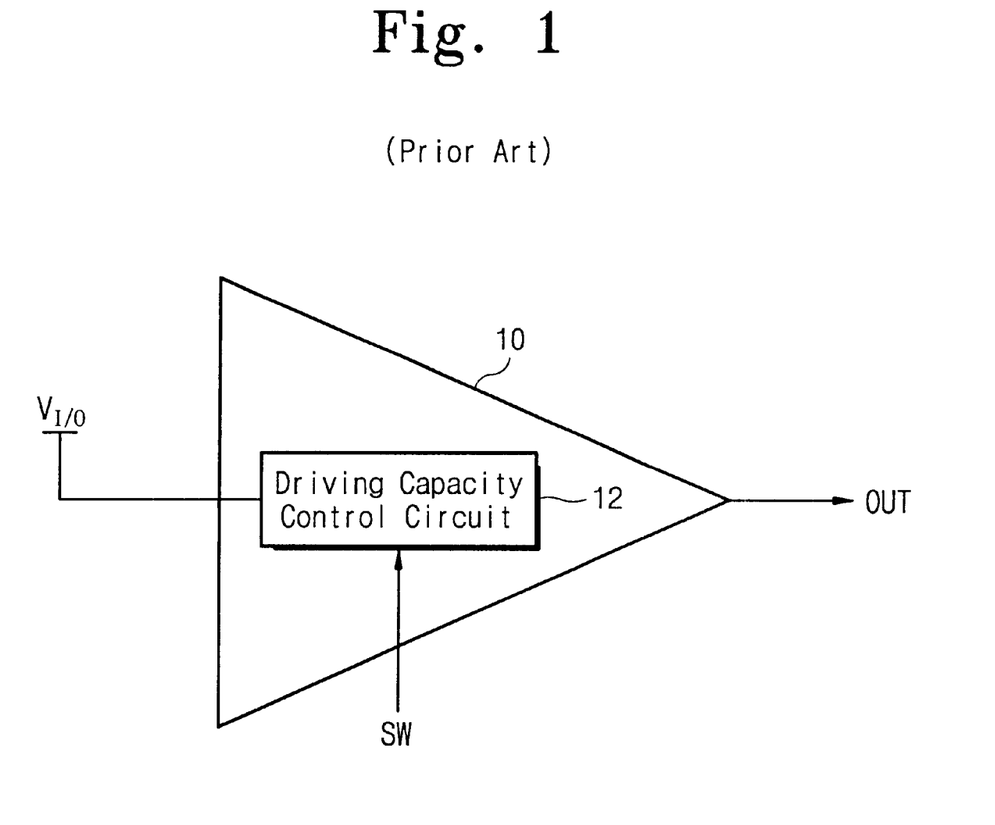
FIG. 1 is a schematic block diagram illustrating a conventional PCI buffer.

FIG. 1 is a schematic block diagram, which illustrates a conventional PCI buffer. Referring to FIG. 1, the PCI buffer 10 should have different driving capacities according to the level of an input signal voltage. Specifically, the driving capacity for a 5V input signal voltage should differ from that for a 3.3 V input signal voltage. A driving capacity control circuit 12 of the PCI buffer 10 functions to control the driving capacities with respect to the input signal voltage. However, because the conventional driving capacity control circuit 12 has no voltage level discriminator, it should be externally provided with a signal for discriminating the voltage level.

A PCI-X bus specification has been proposed that is derived from the PCI bus specification. According to the specification, it is required that a PCI-X bus meet a maximum data transfer rate of 1,033 MB/sec at an operational frequency of 133 MHz in the voltage environment of 3.3V.

Until now, there exists no data output buffer that can be used as both a PCI-X buffer and a PCI buffer.

SUMMARY OF THE INVENTION

It is an object of the invention to provide an improved data processing system having a data output buffer that can be used as both a PCI buffer and a PCI-X buffer.

It is another object of the invention to provide a data processing system having a voltage level discriminator so as to control signal driving capacities according to an input voltage level.

Disclosed is a data processing system comprising a control unit for receiving data from a main core and outputting given control signals, a level shifter for amplifying the electric potential of said given control signals and outputting corresponding driving signals, a data output buffer for receiving said driving signals from said level shifter and outputting a driving voltage having a voltage range defined in the PCI or/and PCI-X specifications, to an input/output pad, and said data output buffer being in a high impedance state to prevent a PCI mode voltage inputted to said pad from being leaked to a power source terminal when said data processing system is operated in PCI mode.

In another aspect of the invention, said data output buffer comprises a pull-up transistor having one end connected to a power source terminal, a first resister coupled between said pad and the other end of said pull-up transistor for controlling a current flowing from said power source terminal to said pad to have a current range that complies with the PCI and PCI-X specifications, a second resister having one end connected to said pad, for controlling a current flowing from said pad to a ground terminal to have a current range that complies with the PCI and PCI-X specifications, a pull-down transistor having one end connected to said ground terminal, a pull-down transistor protection unit coupled between the other end of said second resister and the other end of said pull-down transistor, for controlling said pull-down transistor to make an electric potential of said other end of said pull-down transistor to come to VDD (power source voltage)—$V_{TH}$ (threshold voltage of said pull-down transistor protection unit) in said PCI mode, a leak prevention unit coupled between said pad and a gate of said pull-up transistor, for controlling said pull-up transistor to prevent said current from being leaked from said pad to said power source terminal in said PCI mode, and a pass transistor coupled between said power source terminal and said pad, for passing said driving signals generated from said level shifter, to said gate of said pull-up transistor.

In another aspect of the invention, said pull-up transistor is formed of a PMOS type transistor having a bulk terminal connected to an input voltage to which a voltage of 3.3 or 5V is supplied in said PCI or PCI-X mode.

In another aspect of the invention, said pull-down transistor is formed of a NMOS type transistor.

In another aspect of the invention, said pull-down transistor protection unit is formed of a NMOS type transistor.

In another aspect of the invention, said leak prevention unit is formed of a PMOS type transistor having a bulk terminal connected to an input voltage to which a voltage of 3.3 or 5V is supplied in said PCI or PCI-X mode.

In another aspect of the invention, a voltage of 3.3V is supplied to said power source terminal connected with said one end of said pull-up transistor.

In another aspect of the invention, a voltage of 3.3V is supplied to said power source terminal connected with said gate terminal of said NMOS transistor.

In another aspect of the invention, a voltage of 3.3V is supplied to said power source terminal connected with said gate terminal of said PMOS transistor.

In another aspect of the invention, said control unit includes a voltage level discriminator for discriminating a level of said input voltage inputted from outside to output a discrimination signal, and said data output buffer controls the driving capacity thereof in response to a control signal outputted from said level shifter according to said discrimination signal.

In another aspect of the invention, said data output buffer includes subsidiary pull-up and pull-down transistors to control the driving capacity thereof in response to said control signal corresponding to said discrimination signal.

In another aspect of the invention, said voltage level discriminator comprises a comparative circuit for comparing said input voltage inputted from outside with a standard voltage to output a comparative signal, and a latch circuit for latching said comparative signal.

In another aspect of the invention, said comparative circuit comprises a first voltage distribution circuit for distributing said input voltage to output a first voltage, a second voltage distribution circuit for distributing an power source voltage to output said standard voltage, and a comparator having a non-converted input terminal for receiving said first voltage, a converted input terminal for receiving said standard voltage, and an output terminal for outputting said comparative signal.

In another aspect of the invention, said first voltage distribution circuit comprises a NMOS transistor having a first current electrode, a control electrode connected with a control signal that is activated when said power source voltage is supplied, and a second current electrode connected with a ground voltage, at least two resistors connected in series between said input voltage and said first current electrode of said NMOS transistor, and wherein said first voltage is outputted from one of connecting nodes of said resistors of said first voltage distribution circuit.

In another aspect of the invention, said second voltage distribution circuit comprises a NMOS transistor having a first current electrode, a control electrode connected with said control signal that is activated when said power source voltage is supplied, and a second current electrode connected with said ground voltage, at least two resistors connected in series between said power source voltage and said first current electrode of said NMOS transistor, and wherein said standard voltage is outputted from one of connecting nodes of said resistors of said second voltage distribution circuit.

In another aspect of the invention, said latch circuit is synchronized with a converted signal of said control signal that is activated when said power source voltage is supplied, to latch said comparative signal outputted from said comparator.

Disclosed is a data processing system comprising a control unit for receiving data from a main core and outputting given control signals, having a voltage level discriminator for discriminating a level of an input voltage inputted from outside to output a discrimination signal, and a data output buffer for outputting a driving voltage to an input/output pad in response to the control signals and controlling the driving capacity in response to the discrimination signal.

In another aspect of the invention, said voltage level discriminator comprises a comparative circuit for comparing said input voltage inputted from outside with a standard voltage to output a comparative signal, and a latch circuit for latching said comparative signal.

In another aspect of the invention, said comparative circuit comprises a first voltage distribution circuit for distributing said input voltage to output a first voltage, a second voltage distribution circuit for distributing an power source voltage to output said standard voltage, and a comparator having a non-converted input terminal for receiving said first voltage, a converted input terminal for receiving said standard voltage, and an output terminal for outputting said comparative signal.

In another aspect of the invention, said first voltage distribution circuit comprises a NMOS transistor having a first current electrode, a control electrode connected with a control signal that is activated when said power source voltage is supplied, and a second current electrode connected with a ground voltage, at least two resistors connected in series between said input voltage and said first current electrode of said NMOS transistor, and wherein said first voltage is outputted from one of connecting nodes of said resistors of said first voltage distribution circuit.

In another aspect of the invention, said second voltage distribution circuit comprises a NMOS transistor having a first current electrode, a control electrode connected with said control signal that is activated when said power source voltage is supplied, and a second current electrode connected with said ground voltage, at least two resistors connected in series between said power source voltage and said first current electrode of said NMOS transistor, and wherein said standard voltage is outputted from one of connecting nodes of said resistors of said second voltage distribution circuit.

In another aspect of the invention, said latch circuit is synchronized with a converted signal of said control signal that is activated when said power source voltage is supplied, to latch said comparative signal outputted from said comparator.

Disclosed is a data processing system comprising means for receiving data from a main core and outputting given control signals, means for amplifying the electric potential of said given control signals and outputting corresponding driving signals, buffer means for receiving said driving signals from said level shifter and outputting a driving voltage having a voltage range defined in the PCI or/and PCI-X specifications, to an input/output pad, and said buffer means being in a high impedance state to prevent a PCI mode voltage inputted to said pad from being leaked to a power source terminal when said data processing system is operated in PCI mode, and wherein said buffer means further comprises a pull-up transistor having one end connected to a power source terminal, means for controlling a current flowing from said power source terminal to said pad to have a current range that complies with the PCI and PCI-X specifications, a second resister having one end connected to said pad, for controlling a current flowing from said pad to a ground terminal to have a current range that complies with the PCI and PCI-X specifications, a pull-down transistor having one end connected to said ground terminal, means for controlling said pull-down transistor to make an electric potential of said other end of said pull-down transistor to come to VDD (power source voltage)—$V_{TH}$ (threshold voltage of said pull-down transistor protection unit) in said PCI mode, means for controlling said pull-up transistor to prevent said current from being leaked from said pad to said power source terminal in said PCI mode, and means for passing said driving signals generated from said level shifter, to said gate of said pull-up transistor.

BRIEF DESCRIPTION OF THE DRAWINGS

The foregoing and other objects, features and advantages of the invention will become more apparent from the following detailed description of a preferred embodiment thereof made with reference to the attached drawings, of which.

DETAILED DESCRIPTION OF PREFERRED EMBODIMENTS

The invention now will be described more fully hereinafter with reference to the accompanying drawings, in which referred embodiments of the invention are shown. Like numbers refer to like elements throughout.

A data processing system in accordance with the invention has a mechanism that supports a voltage environment of 3.3V and a data transfer rate of 1,033 MB/s in a PCI-X mode and a voltage environment of 3.3V/5V in a PCI mode.

Figure 2A:
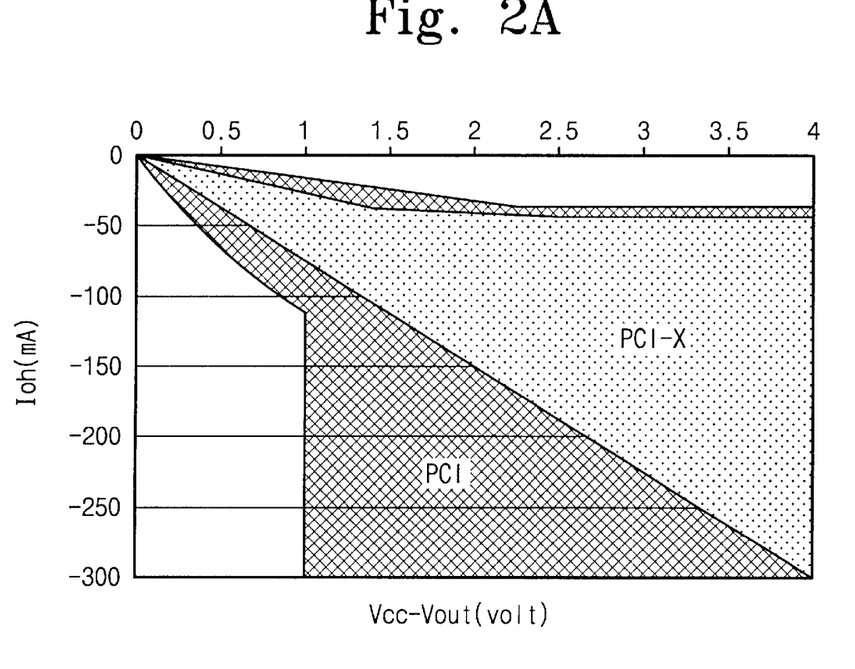
FIG. 2A is a diagram illustrating a driving capacity of a PMOS transistor of a data output buffer, which is defined in the PCI and PCI-X specifications.
Figure 2B:
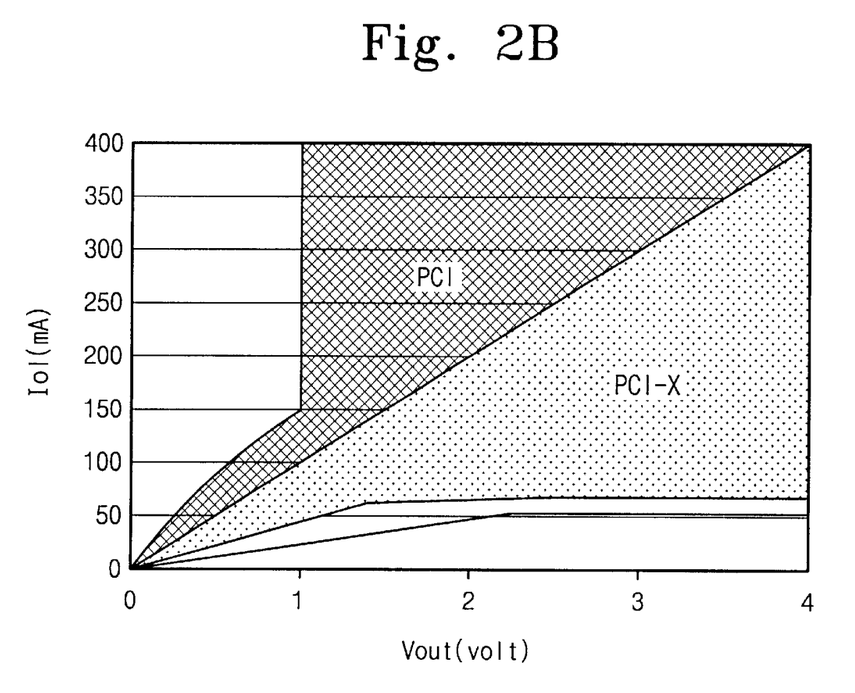
FIG. 2B is a diagram illustrating a driving capacity of a NMOS transistor of a data output buffer, which is defined in the PCI and PCI-X specifications.

FIG. 2A is a diagram showing a driving capacity of a PMOS transistor of the data output buffer, which is defined in the PCI and PCI-X specifications and FIG. 2B is a diagram showing a driving capacity of a NMOS transistor of the data output buffer, which is defined in the PCI and PCI-X specifications.

Referring to FIG. 2A and FIG. 2B, it can be appreciated that the driving capacity of the data output buffers in the PCI-X bus has a restrained toleration current range compared with the driving capacity of the data output buffers in the PCI bus.

Figure 3:
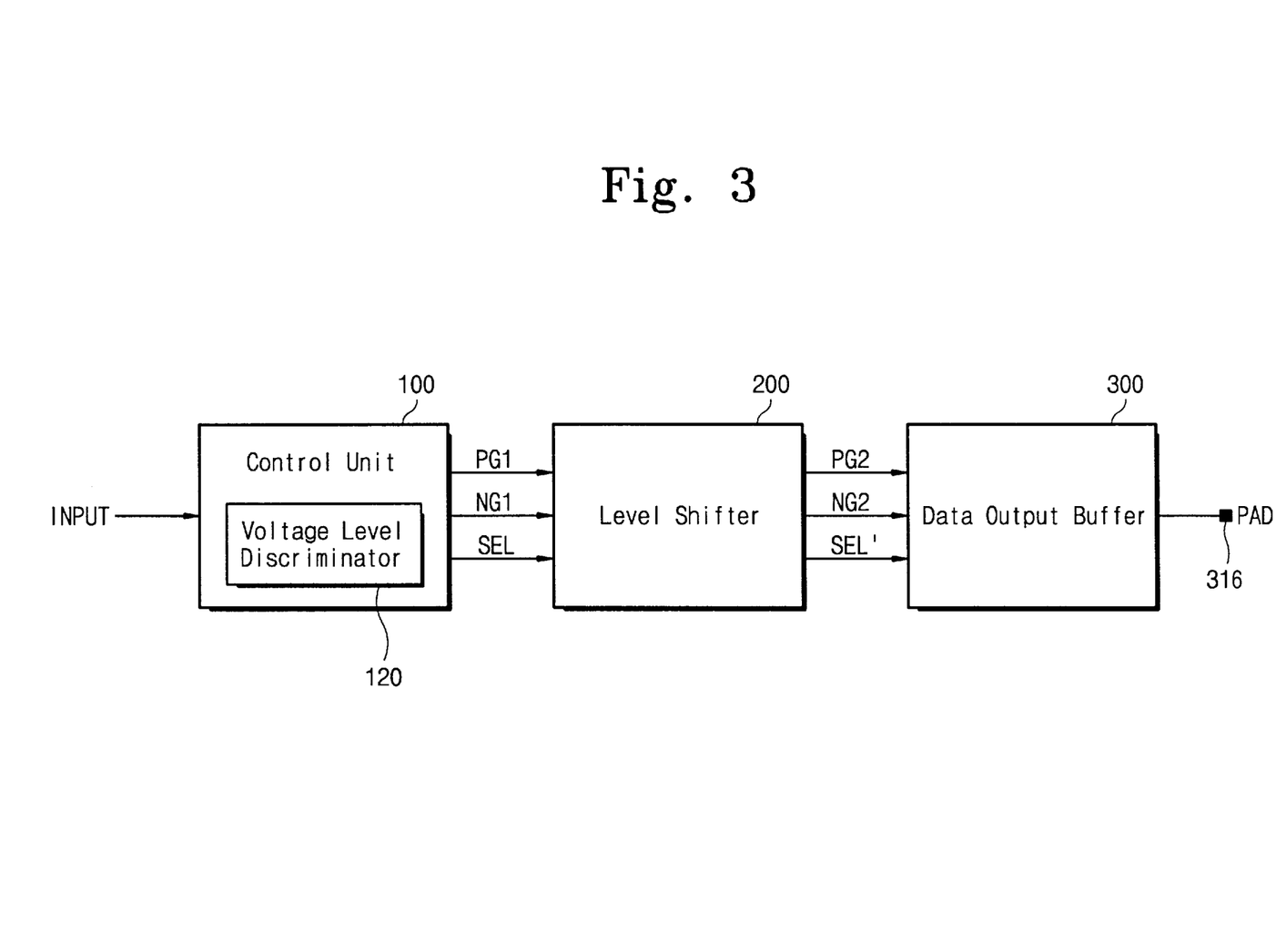
FIG. 3 is a schematic block diagram of a data processing system in accordance with a preferred embodiment of the invention.

FIG. 3 is a block diagram illustrating a data processing system having a data output buffer 300 that can be used as both a PCI-X buffer and a PCI buffer in accordance with the invention. Referring to FIG. 3, the data processing system includes a control unit 100 for receiving data supplied from a main core and outputting control signals PG1, NG1, a level shifter 200, and a data output buffer 300.

Figure 4:
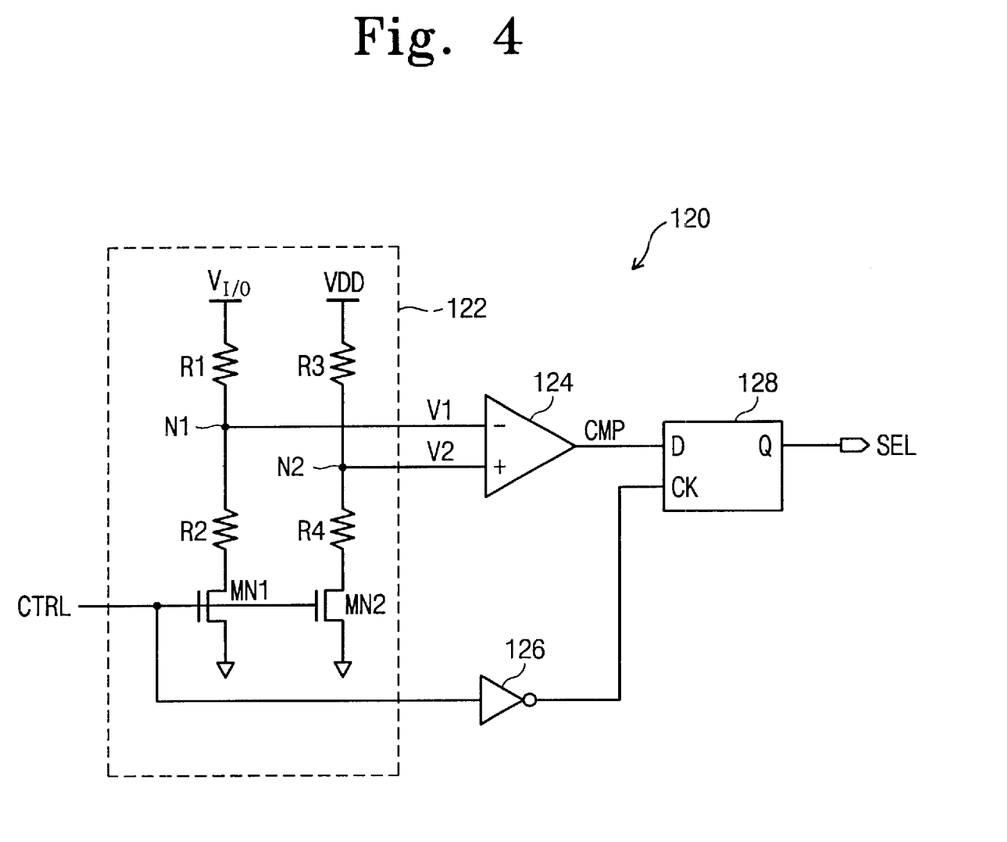
FIG. 4 is a detailed circuit diagram of a voltage level discriminator of a control unit of the data processing system shown in FIG. 3.

The control unit 100 has a voltage level discriminator 120 for discriminating a level of an input voltage. The voltage level discriminator 120, as shown in FIG. 4, comprises a voltage distribution circuit 122, a comparator 124, an inverter 126, and a latch circuit 128. The voltage distribution circuit 122 includes two NMOS transistors MN1, MN2, and four resistors R1, R2, R3, R4. Each of NMOS transistors MN1, MN2 has a first current electrode (i.e., a drain), a second current electrode (i.e., a source) connected to a ground voltage, and a control electrode (i.e., a gate) controlled by a control signal CTRL. The first and second resistors R1, R2 are connected in series between an input voltage $V_{I/O}$ of 3.3V or 5V and the corresponding drain of the NMOS transistor MN1, whereas the third and fourth resistors R3, R4 are connected in series between an inside power source voltage VDD and the corresponding drain of the NMOS transistor NM2.

A first voltage V1 of a first node N1, which is a connecting node of the first and second resistors R1, R2 is defined as the following equation (1).

$$V1 = \{R2/(R1+R2)\} \times (V_{I/O}) \quad (1)$$

Here, resistance values of the first and second resisters R1, R2 are set so that the first voltage V1 can come to 1V and 1.5V when the input voltage $V_{I/O}$ is 3.3V and 5V, respectively. Also, a second voltage V2 of a second node N2, which is a connecting node of the third and fourth resistors R3, R4 is defined as follows.

$$V2 = \{R3/(R3+R4)\} \times (VDD) \quad (2)$$

Here, resistance values of the third and fourth resisters R3, R4 are set so that the second voltage V2 can come to 1.2V according to the inside power source voltage VDD.

In a preferred embodiment, the control signal CTRL is high when the inside power source voltage VDD is supplied, and low when the inside power source voltage VDD is not supplied. Accordingly, the first and second NMOS transistors MN1, MN2 are turned on only when the inside power source voltage VDD is provided to the voltage level discriminator 120, so that current flows from the input voltage $V_{I/O}$ to ground through the first and second resistors R1, R2 and from the inside power source voltage VDD to ground through the third and fourth resistors R3, R4, respectively. Therefore, if the inside power source voltage VDD is not supplied, CTRL remains low and no current flows through either pair of resistors, thereby preventing unnecessary current consumption.

The comparator 124 has a non-inverted input terminal '+' for receiving the first voltage V1 of the first node N1, an inverted input terminal '−' for receiving the second voltage V2 of the second node N2, and an output terminal for outputting a comparative signal CMP according to voltage levels of the first and second voltages V1, V2. For example, when the input voltage $V_{I/O}$ is 3.3V, the first voltage V1 may be 1V, such that the first voltage V1 is lower than the second voltage V2. In which case the comparator 124 outputs a comparative signal CMP at logical low. Alternatively, when the input voltage is 5V, the first voltage V1 may be 1.5V, such that the first voltage V1 is higher than the second voltage V2, thereby causing the comparator 124 to output a logical high.

Figure 5:
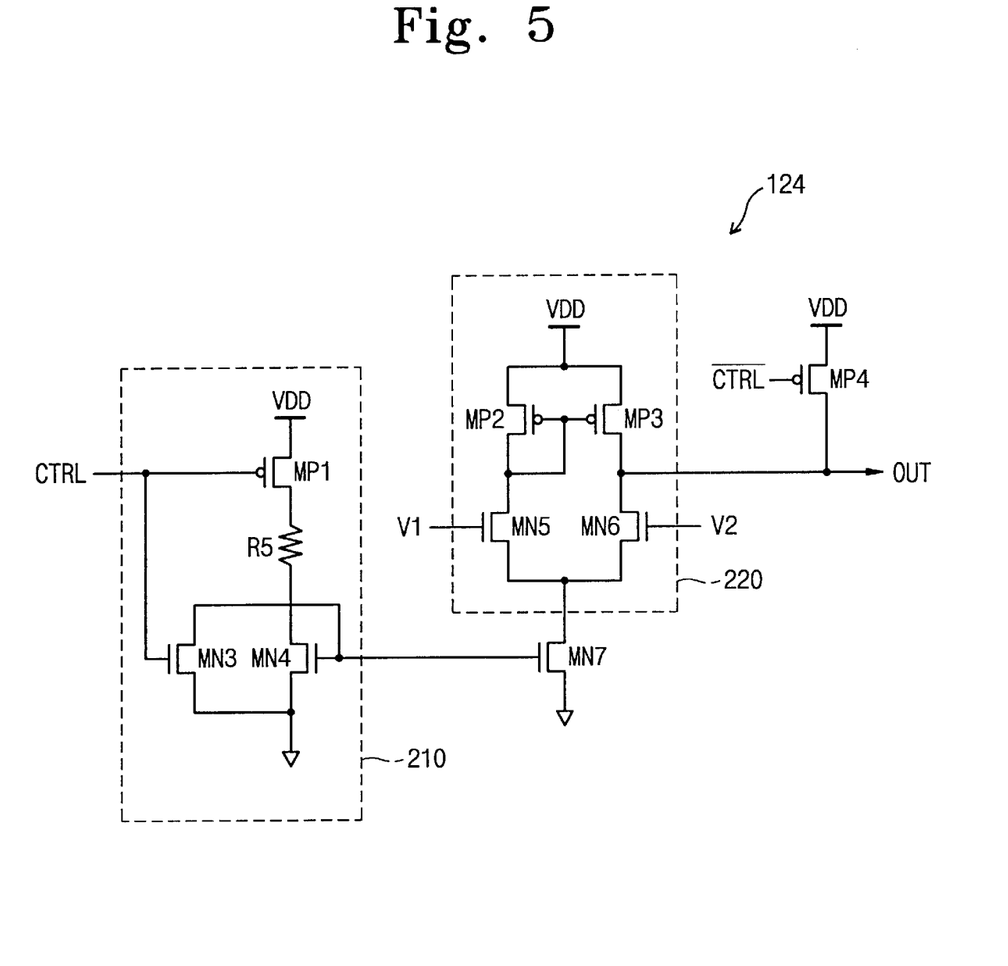
FIG. 5 is a detailed circuit diagram of a comparator shown in FIG. 4.

Referring to FIG. 5, there is shown a circuit diagram of an embodiment of the comparator 124 of FIG. 4, comprising a bias circuit 210, a differential amplifier 220, a NMOS transistor MN7, and a PMOS transistor MP4. The bias circuit 210 comprises a PMOS transistor MP1, NMOS transistors MN3, NM4, and a resistor R5, and provides a bias voltage of a given level to a gate of the NMOS transistor MN7. The PMOS transistor MP1 has a source connected to the power source voltage VDD, a gate connected with the control signal CTRL, and a drain connected to one end of the resistor R5. The NMOS transistor MN3 has a drain connected to the other end of the resistor R5, a gate connected with the control signal CTRL, and a source connected to the ground voltage. The NMOS transistor MN4 has a drain connected with the other end of the resistor R5 and the drain of the NMOS transistor MN3, a gate connected with its own drain, and a source connected with the ground voltage.

The differential amplifier 220 comprises two PMOS transistors MP2, MP3 and two NMOS transistors MN5, MN6. The PMOS transistor MP2 is has a source connected to the power source voltage VDD, and a gate and a drain thereof connected to each other. The PMOS transistor MP3 has a source connected to the power source voltage VDD, a gate connected with the gate of the PMOS transistors MP2, and a drain connected to an output node N3 outputting the comparative signal CMP. The NMOS transistor MN5 has a drain connected to the drain of the PMOS transistor MN2, a gate connected with the first voltage V1 from the first node N1 in the voltage distribution circuit 122 of FIG. 4, and a source connected to the drain of the NMOS transistor MN7. The NMOS transistor MN6 has a drain connected with the drain of the PMOS transistor MP3 at the output node N3 outputting the comparative signal CMP, a gate connected to the second voltage V2 from the second node N2 in the voltage distribution circuit 122 of FIG. 4, and a source connected to the drain of the NMOS transistor MN7.

The NMOS transistor MN7 has a drain connected with the sources of the NMOS transistors MN5, MN6, a gate connected with the gate and the drain of the NMOS transistor MN4, and a source connected to the ground voltage. The PMOS transistor MP4 has a source connected with the power source voltage VDD, a gate connected with the inverted control signal/CTRL, and a drain connected with the output node N3.

The differential amplifier 220 compares a level of the first voltage V1 inputted to the gate of the NMOS transistor MN5 with a level of the second voltage V2 inputted to the gate of the NMOS transistor MN6, and outputs the comparative signal CMP corresponding to a difference between two voltage V1, V2. That is, if the first voltage V1 is higher than the second voltage V2, the power source voltage VDD is outputted as the comparative signal CMP, and if the second voltage V2 is higher than the first voltage V1, the ground voltage is outputted as the comparative signal CMP.

Referring back to FIGS. 3 and 4, a latch circuit 128, comprising a D-flip-flop, is synchronized with the inverted control signal/CTRL to receive the comparative signal CMP outputted from the comparator 124 and latch it. The latch circuit 128 outputs a discrimination signal SEL to the data output buffer 300 via the level shifter 200 to control the driving capacity of the data output buffer 300 (i.e., the number of PMOS and NMOS transistors MP7, MN10 to be driven as will be explained below). Thus, in the invention, there is no need to provide a signal SW (FIG. 1) for discriminating the level of the input voltage from the outside.

Here, it should be noted that in the embodiment of the invention, the voltage level discriminator 120 is explained as an apparatus for discriminating the level of input voltage in the data processing system having the data output buffer, which can use both as a PCI buffer and a PCI-X buffer, but it can be used as an apparatus for discriminating a level of an input voltage in a data processing system having only a PCI data output buffer.

Referring again to FIG. 3, the level shifter 200 amplifies the electric potential of the given control signals PG1, NG1 and the discrimination signal SEL outputted from the control unit 100 and outputs driving signals PG2, NG2, SEL', respectively. This will preferably be done with thin gate oxide transistors having low threshold voltages so as to reduce data propagation delay.

The data output buffer 300 receives the driving signals PG2, NG2 from the level shifter 200 and outputs a driving voltage having a voltage range defined in the PCI and PCI-X specification, to an input/output pad 316. When the data processing system is operated in a PCI input mode, the data output buffer 300 will preferably present a high impedance to prevent a PCI mode voltage of 3.3 or 5V inputted to the input/output pad 316 from being leaked into a power source terminal.

Figure 6:
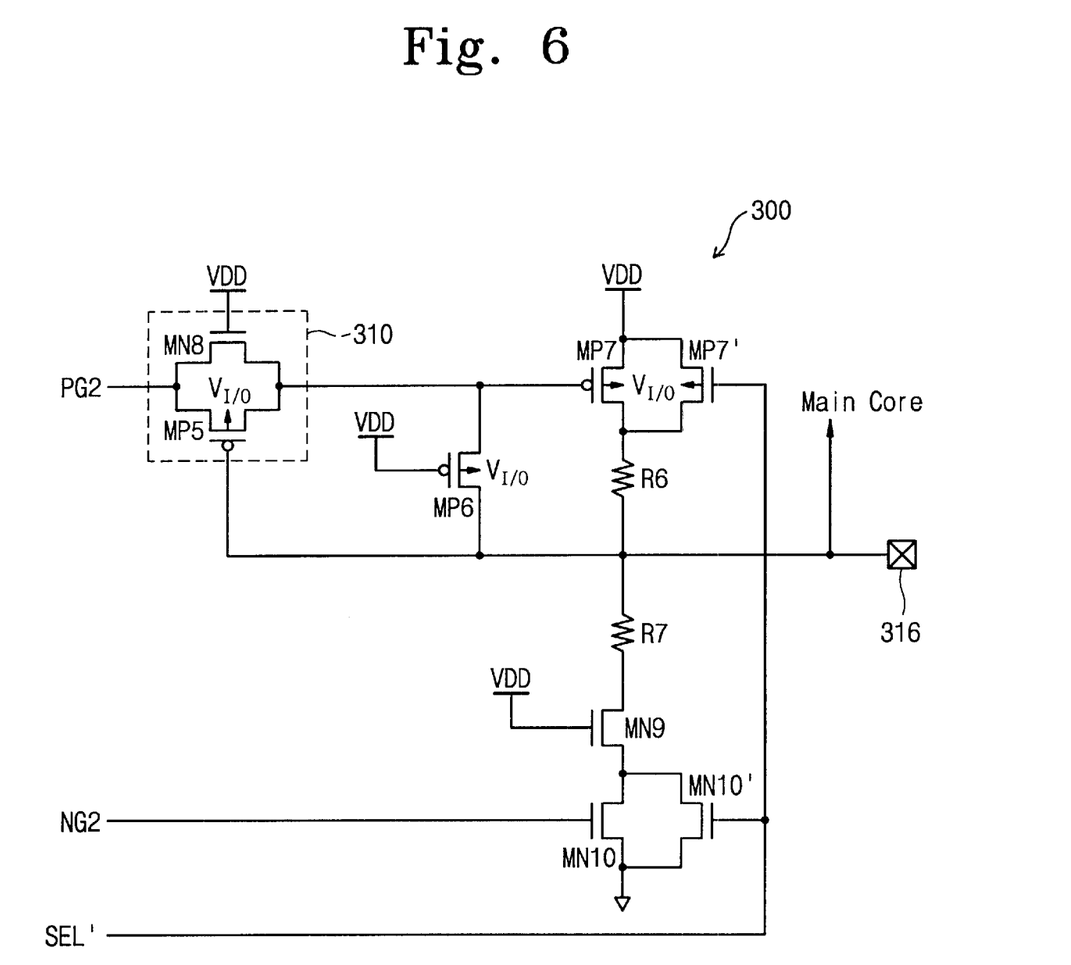
FIG. 6 is a detailed circuit diagram of a data output buffer of the data processing system shown in FIG. 3.

FIG. 6 is a circuit diagram illustrating a preferred embodiment of the data output buffer 300 of FIG. 3, having an input/output pad 316, a pull-up transistor MP7 having one end connected to the inside power source voltage VDD to which the voltage of 3.3V is applied, a first resister R6, a second resister R7, a pull-down transistor MN10, a pull-down transistor protection unit MN9, a leak prevention unit MP6, and a pass transistor 310.

The pull-up transistor MP7 is formed of a PMOS type transistor having a bulk terminal connected to the input voltage $V_{I/O}$ to which a voltage of 3.3 or 5V is supplied in the PCI or PCI-X mode.

The first resister R6 is coupled between the input/output pad 316 and the other end of the pull-up transistor MP7 for controlling a current flowing from the inside power source voltage VDD to the input/output pad 316 to have a current range that complies with the PCI and PCI-X specifications. Accordingly, the first resistor R6 meets the driving capacity of the PCI and PCI-X data output buffers shown in FIG. 2a. That is, when the data output buffer 300 is operated in the voltage environment of 3.3V or 5V in the PCI or PCI-X mode, the first resistor R6 functions to control the current flowing from the inside power source voltage VDD to the input/output pad 316.

The second resister R7 has one end connected to the input/output pad 316, for controlling a current flowing from the input/output pad 316 to a ground terminal so as to have a current range that complies with the PCI and PCI-X specifications. Thus, the second resistor R7 coupled between the input/output pad 316 and the pull-down transistor protection unit MN9 meets the driving capacity specifications of the PCI and PCI-X data output buffers shown in FIG. 2b. That is, when the data output buffer is operated in a voltage environment of 3.3V or 5V in the PCI or PCI-X mode, the second resistor R7 functions to control the current flowing from the input/output pad 316 to the ground terminal.

The pull-down transistor MN10 has one end connected to the ground terminal, and a gate for receiving the driving signal NG2 supplied from the level shifter 200. The pull-down transistor MN10 is formed of a NMOS-type transistor.

The pull-down transistor protection unit MN9 is coupled between the other end of the second resister R7 and the other end of the pull-down transistor MN10 for controlling the pull-down transistor MN10 to cause the voltage at the other end of the pull-down transistor MN10 to go to VDD (power source voltage)—$V_{TH}$ (threshold voltage of MN9) in the PCI mode. The pull-down transistor protection unit MN9 is formed of a NMOS type transistor having a gate connected to the inside power source voltage VDD, to which the voltage of 3.3V is applied.

The leak prevention unit MP6 is coupled between the input/output pad 316 and a gate of the pull-up transistor MP7 for controlling the voltage at the gate of the pull-up transistor MP7 to prevent the current from being leaked from the input/output pad 316 to the inside power source voltage VDD in the PCI mode. The leak prevention unit MP6 comprises a PMOS-type transistor having a bulk terminal connected to the input voltage $V_{I/O}$ to which a voltage of 3.3 or 5V is supplied in the PCI or PCI-X mode, and a gate connected to the inside power source voltage VDD to which a voltage of 3.3V is applied.

The pass transistor 310 is coupled between the inside power source voltage and the input/output pad 316, for passing the driving signal PG2 supplied from the level shifter 200, to the gate of the pull-up transistor MP7. The pass transistor 310 is formed of a NMOS transistor MN8 having a gate connected to the inside power source voltage VDD to which the voltage of 3.3V is supplied, and a PMOS transistor MP5 having a bulk terminal connected to the input voltage $V_{I/O}$ to which the voltage of 3.3 or 5V is supplied in the PCI or PCI-X mode, and a gate connected to the input/output pad 316.

To control the driving capacity of the data output buffer 300 in response to the driving signal SEL' outputted from the level shifter 200, the data output buffer 300 of the data processing system has extra or subsidiary PMOS and NMOS transistors MP7' and MP10' that are connected in parallel with the PMOS and NMOS transistors MP7, MN10, respectively. The subsidiary PMOS and NMOS transistors are turned on or off according to the driving signal SEL', and thereby the number of the PMOS and NMOS transistors MP7, MP7', MN10, MP10' to be driven is controlled to allow the data output buffer 300 to have the driving capacity corresponding to the voltage environment of the PCI and PCI-X mode.

As described above, the data processing system of the invention has the data output buffer 300 that can be used as a PCI buffer as well as the PCI-X buffer. The data output buffer 300 can stably drive data at the voltage environment of 3.3V during the PCI-X mode. That is, the data output buffer stably transmits the data supplied from a main core to each peripheral unit. Also, the data output buffer can drive the data at the voltage environment of 3.3V or 5V in the PCI mode.

The operation of the data output buffer 300 at the voltage environment of 3.3V in the PCI-X mode is as follows:

Referring to FIG. 3, the control unit 100 receives data from the main core and outputs control signals PG1, NG1 to the level shifter 200. At this time, the voltage level discriminator 120 of the control unit 100 senses an input voltage $V_{I/O}$ of 3.3V and outputs a discrimination signal SEL corresponding to the input voltage $V_{I/O}$ of 3.3V to the level shifter 200.

Referring to FIGS. 3 and 6, consider a case where the data output buffer 300 outputs a logical high voltage to the input/output pad 316, the voltage level discriminator 120 supplies driving signals PG2, NG2 at logical low to an input terminal of the data output buffer 300. In the data output buffer 300, the pull-up transistor MP7 is turned on and the pull-down transistor MN10 is turned off by the driving signals PG2, NG2. Accordingly, the logic high level voltage of 3.3V is outputted onto the pad 316.

On the other hand, if the level shifter 200 supplies driving signals PG2, NG2 at logical high to the input terminal of the data output buffer 300, in the data output buffer 300, the pull-up transistor MP7 is turned off and the pull-down transistor MN10 and the pull-down transistor protection unit MN9 are turned on by the driving signals PG2, NG2. Accordingly, a logic low level voltage is outputted onto the pad.

Also, according to a driving signal SEL' corresponding to the discrimination signal SEL inputted to the level shifter 200, the data output buffer 300 controls the driving capacity, that is to say, the number of parallel PMOS and NMOS transistors MP7, MN10 to be driven by turning the subsidiary PMOS and NMOS transistors MP7, MN10 on or off to suit to the voltage of 3.3V.

The operation of the data output buffer 300 at the voltage environment of 3.3V/5V of the PCI mode is as follows:

Referring to FIG. 6, the bulk terminals of the PMOS transistors MP5, MP6, MP7, as described above, are supplied with an input voltage $V_{I/O}$ of 3.3V when the data processing system is operated in the PCI-X mode, and an input voltage $V_{I/O}$ of 3.3V or 5V when the data processing system is operated in the PCI mode. Because the operation of the data output buffer 300 at the voltage environment of 3.3V in the PCI mode is the same as that in the PCI-X mode, it will not be explained. Also, even at the voltage environment of 5V, operations that are identical to those of the PCI-X mode will not be explained.

The pass transistor 310, the pull-down transistor protection unit MN9, and the leak prevention unit MP6 support the voltage environment of 5V in the PCI mode. That is, when the data output buffer 300 is at a high impedance state and the input/output pad 316 is supplied with an input voltage $V_{I/O}$ of 5V, the leak prevention unit MP6 controls a voltage between the gate and the source of the pull-up transistor MP7 so as to turn it off it completely, and the pull-down transistor protection unit MN9 makes a voltage between the gate and the source of the pull-down transistor MN10 to come to 3.3V—$V_{TH}$ (threshold voltage of MN9) at a maximum.

More specifically, if the bulk terminal of the pull-up transistor MP7 is supplied with the input voltage $V_{I/O}$ of 5V, (i.e., a voltage of 5V is inputted to the input/out pad 316) a current passage is formed between the drain and the source of the PMOS transistor MP7. A current is leaked onto the substrate from the input/output pad 316, which is in a high impedance state, threatening a malfunction of the system. To solve the problem, the leak prevention unit MP6 prevents current from being leaked from the input/output pad 316 to the inside power source voltage VDD of 3.3V by preventing the pull-up transistor MP7 from being turned on by a voltage difference between the gate and the drain of the pull-up transistor MP7 when 5V is supplied to the input/output pad 316. Specifically, a maximum electric potential supplied to the gate of the pull-up transistor MP7 is 3.3V, so that when the voltage of 5V is inputted to the input/output pad 316, the voltage difference between the gate and drain of the pull-up transistor MP7 comes to 1.7 V to turn on the pull-up transistor MP7. To solve the problem, the invention has a mechanism in which the electric potential of the gate of the pull-up transistor MP7 is the same as that of the input/output pad 316 at the voltage environment of 5V in the PCI mode. That is, the leak prevention unit MP6 forces the voltage at the gate of the pull-up transistor MP7 to equal that of the input/output pad 316 in the PCI mode.

Also, the invention further includes the pull-down transistor protection unit MN9 between the second resistor R7 and the pull-down transistor MN10. The pull-down transistor protection unit MN9 makes the electric potential between the gate and source of the pull-down transistor MN10 and the electric potential of a drain thereof to come to no more than a maximum of 3.3V—$V_{TH}$ (threshold voltage of MN9) even if 5V is inputted to the input/output pad 316

As is apparent from the foregoing description, the data processing system of the invention provides a data output buffer that is stably operated at the voltage environment of 3.3V/5V in the PCI mode as well as the voltage environment of 3.3V in the PCI-X mode. The data output buffer stably drives the data supplied from the main core in the PCI-X mode, and ensures that a high impedance state is maintained even at a voltage of 5V inputted to the pad in the PCI mode. For this, the data output buffer has leak prevention and pull-down transistor protection units that effectively control the pull-up and pull-down transistors. Further, the data output buffer includes resistors and parallel transistors to provide the driving capacity that complies with the PCI and PCI-X mode. Also, the data processing system of the invention has the voltage level discriminator for discriminating the level of the input voltage automatically. Accordingly, in the invention, there is no need to provide a signal SW for discriminating the level of the input voltage from the outside.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A data processing system comprising:
   a control unit for receiving data from a main core and outputting given control signals;
   a level shifter for amplifying the electric potential of said given control signals and outputting corresponding driving signals; and
   a data output buffer for receiving said driving signals from said level shifter and outputting a driving voltage having a voltage range defined in the PCI or/and PCI-X specifications, to an input/output pad,
   wherein said data output buffer, being in a high impedance state to prevent a PCI mode voltage inputted to said pad from being leaked to a power source terminal when said data processing system is operated in PCI mode, comprises:
   a pull-up transistor having one end connected to a power source terminal;
   a first resistor coupled between said pad and the other end of said pull-up transistor for controlling a current flowing from said power source terminal to said pad to have a current range that complies with the PCI and PCI-X specifications;
   a second resistor having one end connected to said pad, for controlling a current flowing from said pad to a ground terminal to have a current range that complies with the PCI and PCI-X specifications;
   a pull-down transistor having one end connected to said ground terminal;
   a pull-down transistor protection unit coupled between the other end of said second resistor and the other end of said pull-down transistor, for controlling said pull-down transistor to make an electric potential of said other end of said pull-down transistor to come to VDD (power source voltage)—$V_{TH}$ (threshold voltage of said pull-down transistor protection unit) in said PCI mode;
   a leak prevention unit coupled between said pad and a gate of said pull-up transistor, for controlling said pull-up transistor to prevent said current from being leaked from said pad to said power source terminal in said PCI mode; and
   a pass transistor coupled between said power source terminal and said pad, for passing said driving signals generated from said level shifter, to said gate of said pull-up transistor.

2. The data processing system according to claim 1, wherein said pull-up transistor is formed of a PMOS type transistor having a bulk terminal connected to an input voltage to which a voltage of 3.3 or 5V is supplied in said PCI or PCI-X mode.

3. The data processing system according to claim 1, wherein said pull-down transistor is formed of a NMOS type transistor.

4. The data processing system according to claim 1, wherein said pull-down transistor protection unit is formed of a NMOS type transistor.

5. The data processing system according to claim 4, wherein a voltage of 3.3V is supplied to said power source terminal connected with said gate terminal of said NMOS transistor.

6. The data processing system according to claim 1, wherein said leak prevention unit is formed of a PMOS type transistor having a bulk terminal connected to an input voltage to which a voltage of 3.3 or 5V is supplied in said PCI or PCI-X mode.

7. The data processing system according to claim 6, wherein a voltage of 3.3V is supplied to said power source terminal connected with said gate terminal of said PMOS transistor.

8. The data processing system according to claim 1, wherein a voltage of 3.3V is supplied to said power source terminal connected with said one end of said pull-up transistor.

9. A data processing system comprising:
   a control unit for receiving data from a main core and outputting given control signals;
   a level shifter for amplifying the electric potential of said given control signals and outputting corresponding driving signals; and
   a data output buffer for receiving said driving signals from said level shifter and outputting a driving voltage having a voltage range defined in the PCI or/and PCI-X specifications, to an input/output pad,
   wherein said data output buffer, being in a high impedance state to prevent a PCI mode voltage inputted to said pad from being leaked to a power source terminal when said data processing system is operated in PCI mode, controls the driving capacity thereof in response to a control signal outputted from said lever shifter according to a discrimination signal, and includes subsidiary a pull-up and pull-down transistors control the driving capacity thereof in response to said control signal corresponding to said discrimination signal;
   wherein said control unit includes a voltage level discriminator for discriminating a level of an ouput voltage inputted from outside to output said discrimination signal;
   wherein said voltage level discriminator comprises:
   a comparative circuit for comparing said input voltage inputted from outside with a standard voltage to output a comparative signal; and
   a latch circuit for latching said comparative signal.

10. The data processing system according to claim 9, wherein said comparative circuit comprises:
    a first voltage distribution circuit for distributing said input voltage to output a first voltage;
    second voltage distribution circuit for distributing a power source voltage to output said standard voltage; and
    a comparator having a non-converted input terminal for receiving said first voltage, a converted input terminal for receiving said standard voltage, and an output terminal for outputting said comparative signal.

11. The data processing system according to claim 10 wherein said first voltage distribution circuit comprises:
    a NMOS transistor having a first current electrode, a control electrode connected with a control signal that is activated when said power source voltage is supplied, and a second current electrode connected with a ground voltage;
    at least two resistors connected in series between said input voltage and said first current electrode of said NMOS transistor; and
    wherein said first voltage is outputted from one of connecting nodes of said resistors of said first voltage distribution circuit.

12. The data processing system according to claim 10 wherein said second voltage distribution circuit comprises:

a NMOS transistor having a first current electrode, a control electrode connected with a control signal that is activated when said power source voltage is supplied, and a second current electrode connected with a ground voltage;

at least two resistors connected in series between said power source voltage and said first current electrode of said NMOS transistor; and wherein said standard voltage is outputted from one of connecting nodes of said resistors of said second voltage distribution circuit.

13. The data processing system according to claim 10, wherein said latch circuit is synchronized with a converted signal of said control signal that is activated when said power source voltage is supplied, to latch said comparative signal outputted from said comparator.

14. A data processing system comprising:

a control unit for receiving data from a main core and outputting given control signals, having a voltage level discriminator for discriminating a level of an input voltage inputted from outside to output a discrimination signal, and a data output buffer for outputting a driving voltage to an input/output pad in response to the control signals and controlling the driving capacity in response to the discrimination signal;

a comparative circuit for comparing said input voltage inputted from outside with a standard voltage to output a comparative signal; and a latch circuit for latching said comparative signal.

15. The data processing system according to claim 14, wherein said comparative circuit comprises:

a first voltage distribution circuit for distributing said input voltage to output a first voltage;

a second voltage distribution circuit for distributing an power source voltage to output said standard voltage; and a comparator having a non-converted input terminal for receiving said first voltage, a converted input terminal for receiving said standard voltage, and an output terminal for outputting said comparative signal.

16. The data processing system according to claim 15 wherein said first voltage distribution circuit comprises:

a NMOS transistor having a first current electrode, a control electrode connected with a control signal that is activated when said power source voltage is supplied, and a second current electrode connected with a ground voltage;

at least two resistors connected in series between said input voltage and said first current electrode of said NMOS transistor; and wherein said first voltage is outputted from one of connecting nodes of said resistors of said first voltage distribution circuit.

17. The data processing system according to claim 15 wherein said second voltage distribution circuit comprises:

a NMOS transistor having a first current electrode, a control electrode connected with a control signal that is activated when said power source voltage is supplied, and a second current electrode connected with a ground voltage;

at least two resistors connected in series between said power source voltage and said first current electrode of said NMOS transistor; and wherein said standard voltage is outputted from one of connecting nodes of said resistors of said second voltage distribution circuit.

18. The data processing system according to claim 15 wherein said latch circuit is synchronized with a converted signal of said control signal that is activated when said power source voltage is supplied, to latch said comparative signal outputted from said comparator.

19. A data processing system comprising:

means for receiving data from a main core and outputting given control signals;

means for amplifying the electric potential of said given control signals and outputting corresponding driving signals;

buffer means for receiving said driving signals from said means for amplifying and outputting a driving voltage having a voltage range defined in the PCI or/and PCI-X specifications, to an input/output pad; and said buffer means being in a high impedance state to prevent a PCI mode voltage inputted to said pad from being leaked to a power source terminal when said data processing system is operated in PCI mode; and wherein said buffer means further comprises:

a pull-up transistor having one end connected to a power source terminal;

a first resistor having one end connected to said pad for controlling a current flowing from said power source terminal to said pad to have a current range that complies with the PCI and PCI-X specifications;

a second resistor having one end connected to said pad, for controlling a current flowing from said pad to a ground terminal to have a current range that complies with the PCI and PCI-X specifications;

a pull-down transistor having one end connected to said ground terminal;

means for controlling said pull-down transistor to make an electric potential of said other end of said pull-down transistor to come to VDD (power source voltage)—$V_{TH}$ (threshold voltage of said pull-down transistor protection unit) in said PCI mode;

means for controlling said pull-up transistor to prevent said current from being leaked from said pad to said power source terminal in said PCI mode; and means for passing said driving signals generated from said level shifter, to said gate of said pull-up transistor.

* * * * *